US011563433B2

(12) United States Patent
Fechalos et al.

(10) Patent No.: US 11,563,433 B2
(45) Date of Patent: Jan. 24, 2023

(54) DIRECT CURRENT CIRCUIT SWITCH

(71) Applicant: C&C Power, Inc., Carol Stream, IL (US)

(72) Inventors: William Fechalos, Carol Stream, IL (US); Adam Telengater, Carol Stream, IL (US); Shu-Jen Chen, Carol Stream, IL (US)

(73) Assignee: C&C Power, Inc., Carol Stream, IL (US)

(*) Notice: Subject to any disclaimer, the term of this patent is extended or adjusted under 35 U.S.C. 154(b) by 377 days.

(21) Appl. No.: 17/061,778

(22) Filed: Oct. 2, 2020

(65) Prior Publication Data

US 2021/0111717 A1  Apr. 15, 2021

Related U.S. Application Data

(60) Provisional application No. 62/913,287, filed on Oct. 10, 2019.

(51) Int. Cl.
*H02H 9/00* (2006.01)
*H03K 17/687* (2006.01)
(Continued)

(52) U.S. Cl.
CPC ..... *H03K 17/687* (2013.01); *G01R 19/16538* (2013.01); *G01R 33/07* (2013.01);
(Continued)

(58) Field of Classification Search
None
See application file for complete search history.

(56) References Cited

U.S. PATENT DOCUMENTS 3,675,002 A * 7/1972 Mitsui .............. G06G 7/63
703/4
4,672,246 A * 6/1987 Donovan ........... H03K 17/161
327/437
(Continued)

OTHER PUBLICATIONS

Allegro MicroSystems, ACS772 Datasheet, "High Accuracy, Hall-Effect-Based, 200 kHz Bandwidth, Galvanically Isolated Current Sensor IC with 100 µΩ Current Conductor", Aug. 28, 2019, 42 pages.

(Continued)

*Primary Examiner* — Stephen W Jackson
(74) *Attorney, Agent, or Firm* — Crowell & Moring LLP

(57) ABSTRACT

An apparatus, system and method of controlling the supply of DC current from a power source to an electrical load provides for a protective circuit that senses the characteristics of the connected load prior to permitting the enablement of a switch connecting the supply and the load. A voltage arising from applying a constant current to the load during a time period is compared with a predetermined threshold determined by the intended capacity of the switch so that, when closed, the current through the switch is compatible with the switch. The protective circuit may be used in conjunction with semiconductor switches, electromechanical contactors or relays. A plurality of such devices may be incorporated in an enclosure and controlled by logic so as to manage the supply of power from a power source to a plurality of electrical loads having differing power requirements.

26 Claims, 8 Drawing Sheets

(51) Int. Cl.
    *G05F 1/565*     (2006.01)
    *H03K 17/18*     (2006.01)
    *H02H 3/20*     (2006.01)
    *H03K 5/24*     (2006.01)
    *G01R 33/07*     (2006.01)
    *G01R 19/165*     (2006.01)

(52) U.S. Cl.
    CPC ............. *G05F 1/565* (2013.01); *H02H 3/202* (2013.01); *H03K 5/24* (2013.01); *H03K 17/18* (2013.01)

(56) References Cited

U.S. PATENT DOCUMENTS

| | | | |
|---|---|---|---|
| 6,218,930 | B1 | 4/2001 | Katzenberg et al. |
| 6,317,311 | B1 | 11/2001 | Middlehurst et al. |
| 7,031,130 | B2 | 4/2006 | Simonelli et al. |
| 7,821,753 | B2 | 10/2010 | Evans et al. |
| 7,848,073 | B2 * | 12/2010 | Takahashi ............ H03K 17/687 361/93.1 |
| 8,058,700 | B1 | 11/2011 | Sullivan |
| 8,270,138 | B2 | 9/2012 | Takahashi et al. |
| 8,891,218 | B2 * | 11/2014 | Holley ................... H03K 17/18 361/86 |
| 9,160,165 | B2 | 10/2015 | Cortigiani et al. |
| 9,449,777 | B2 | 9/2016 | Sievi-Korte et al. |
| 9,620,951 | B2 | 4/2017 | Syngaevskiy et al. |
| 9,742,185 | B2 | 8/2017 | Wang et al. |
| 9,846,469 | B2 | 12/2017 | Tomas et al. |
| 9,871,508 | B2 | 1/2018 | Xiao et al. |
| 10,097,172 | B2 | 10/2018 | Joos et al. |
| 2017/0047771 | A1 | 2/2017 | Motsenbocker |

OTHER PUBLICATIONS

Dmello, Shreyas et al.; Texas Instruments, "Adjustable Current Limit of Smart Power Switches", Application Report, SLVA859B-Nov. 2016—Revised Jan. 2019, 20 pages.

* cited by examiner

DC Switch System
System Settings

Number of Switches  [8]

Menu

FIG. 5A

System Summary

| 1 | Server Room    | On  | Normal | 2.4A |
|---|----------------|-----|--------|------|
| 2 | 3rd Floor      | Off | Normal | 0.0A |
| 3 | Basement       | Off | Normal | 0.0A |
| 4 | Building D     | Off | Normal | 0.0A |
| 5 | Racks 1-27     | Off | Normal | 0.0A |
| 6 | Inverter Stack | Off | Normal | 0.0A |
| 7 | Generator Area | Off | Normal | 0.0A |
| 8 | Annex          | Off | Normal | 0.0A |

Menu

FIG. 5B

DIRECT CURRENT CIRCUIT SWITCH

This application claims the benefit of priority to U.S. provisional application Ser. No. 62/913,287, "Direct Current Circuit Switch", filed on, Oct. 10, 2019, which is incorporated herein by reference in its entirety.

TECHNICAL FIELD

This application may be relevant to the control of DC power.

BACKGROUND

Direct current (DC) power may be needed for many types of telephone communication equipment, for control equipment used at electric utility substations, for computer data centers, and power plants, and other similar uses. The DC power may be supplied, for example, by a DC power source which may be supplied with AC power from an AC power source, such as the local power grid, solar energy conversion, wind generated power, or a generator and prime mover. In other configurations, the DC power source may be a storage battery system or a back-up storage battery arrangement. Thus the equipment may be supplied with AC power and perform the power conversion and regulation internal to an equipment, or by an external DC power source, perhaps replenished by any of the sources previously mentioned.

In some instances the individual equipment or cabinets of equipment may be supplied directly from a DC power source. The DC power source may have sufficient capacity to supply a plurality of devices such as computers, switch arrays and the like, where each one of the individual loads devices consumes less than the maximum capacity of the associated DC power source. It may be desirable to control the provision of the power to each individual device or to groups of devices, so as to facilitate the removal and replacement of a device, for example, for servicing, or to disable and re-power for rebooting a computer, or the like. This may be performed by switches local to the equipment, or at the DC power source and these switches may be remotely controlled as the location of the load devices may be distant from the control or monitoring facility.

When a DC power switch uses a semiconductor element, such as a MOSFET, temporary overloads are poorly tolerated. Often such devices are oversized in current carrying capability, provided with large heat sinks, or the like. Still, temporary overloads associated with short circuits, or input current surges may cause irreparable damage. This is particularly true when a plurality of DC power switches are used to distribute the power from a single large DC supply to a plurality of devices, each consuming a fraction of the total power. One not wish to depend on the capacity of the supply to limit the total current that may flow through one of the switches to a non-destructive value. Moreover, the operation of a power supply control arrangement should preferably serve to isolate a fault or overload occurring in one or more loads from affecting the supply of power from a common source to other operating loads.

Both AC and DC circuit breakers are known and have a primary function of protecting the power source against overload and damage due to a fault or overload in the equipment supplied. Circuit breakers differ from fuses in that circuit breakers can be reset, while fuses need replacement. Existing circuit breakers monitor the current being passed through the breaker and open the circuit if a fault or overload condition is encountered. However, to perform this function, the circuit breaker must be turned on, supplying power to the load and an existing fault would cause a trip of the breaker with a transient effect on the power source. Alternatively, the may be no equipment connected to the output of the circuit breaker and a voltage may be inadvertently applied to an exposed power terminal.

SUMMARY

A protective circuit for safely enabling power to be supplied to a load through an electrical switch, comprising: a voltage sensor and a constant current source connected to the output terminal of an electrically controllable switch. Prior to placing the switch in a conductive mode, a control function of the protective circuit assembly, which may be either logic or a microcontroller executing instructions stored in a non-volatile memory, actuates the constant current source for a predetermined period of time while measuring the resultant voltage. The control circuit compares the measured voltage, using the output of a voltage comparator or an analog-to-digital converter and based on predetermined criteria for the measured voltage determines whether the switch can be safely actuated without exceeding the capacity of the power supply. The controller may also determine if there is no electrical load connected to the switch output.

The switch may be either a semiconductor device such as a MOSFET or pass transistor, or an electrically controllable contactor or switch. The protective circuit may also include a current sensor disposed between the power supply and the load, and if the measured current exceeds a preset value (which may include time averaging or the like) the switch may be placed in a non-conductive mode; that is, "tripped" in circuit breaker parlence. The current sensor may be a Hall-effect device or other suitable means of measuring current, including optical current sensors.

In another aspect, a method of managing the supply of power in a DC circuit includes providing a switch that comprises: a semiconductor switch element having a selectable conducting or non-conducting state, configured to be disposed in a path between the DC power supply and the load, and having a source connection and a load connection; a constant current source connected to the load connection for a short time period; a voltage sensor connected to the load connection; and a circuit configured to compare the voltage measured by the voltage sensor with a predetermined voltage threshold, where the predetermined voltage threshold is selected such that when the switch is enabled to apply the DC voltage from the power supply to the load, the resultant current does not exceed the intended maximum current to be supplied to the load. The maximum current may be one of, for example, the rated current of the circuit (e.g., 25 AMPS), or a maximum current limit received from a controller. The predetermined threshold voltage may also take other factors into account such as the characteristics of the current through the switch that would result in tripping the DCSS, which may include an allowance for measurement and voltage tolerances, a known transient at startup or the like.

When a DC voltage is present at the source connection, and a control signal is received or is already present to turn on the DCSS, a microcontroller executes instructions stored on a non-transient non-volatile digital memory to perform the steps of: controlling the constant current source to apply a predetermined current to the load connection for a predetermined period of time; using the voltage sensor to determine the voltage at the load terminal during a period of time when the constant current source is applying the predetermined current; and selecting between the steps of: changing the state of the semiconductor switch to conducting if the voltage exceeds a predetermined voltage level threshold during the predetermined period of time; or, maintaining the state of the semiconductor switch in a non-conducting state and indicating a fault.

A status of the switch may be stored in a non-volatile memory so that the status and operating criteria of the switch may be maintained in the event of restoration of the power after a power failure: if the status of the switch was conducting at the time of power failure, sending a control signal to the microprocessor to turn on the switch and, if the status of the switch was non-conducting, doing nothing.

BRIEF DESCRIPTION OF THE DRAWINGS

FIG. 5A is a representation an initial screen format of the display of FIG. 4;

FIG. 5B is another representation of a screen format where the individual DCSS may be identified as to function and key operating states displayed;

DESCRIPTION

Figure 1:
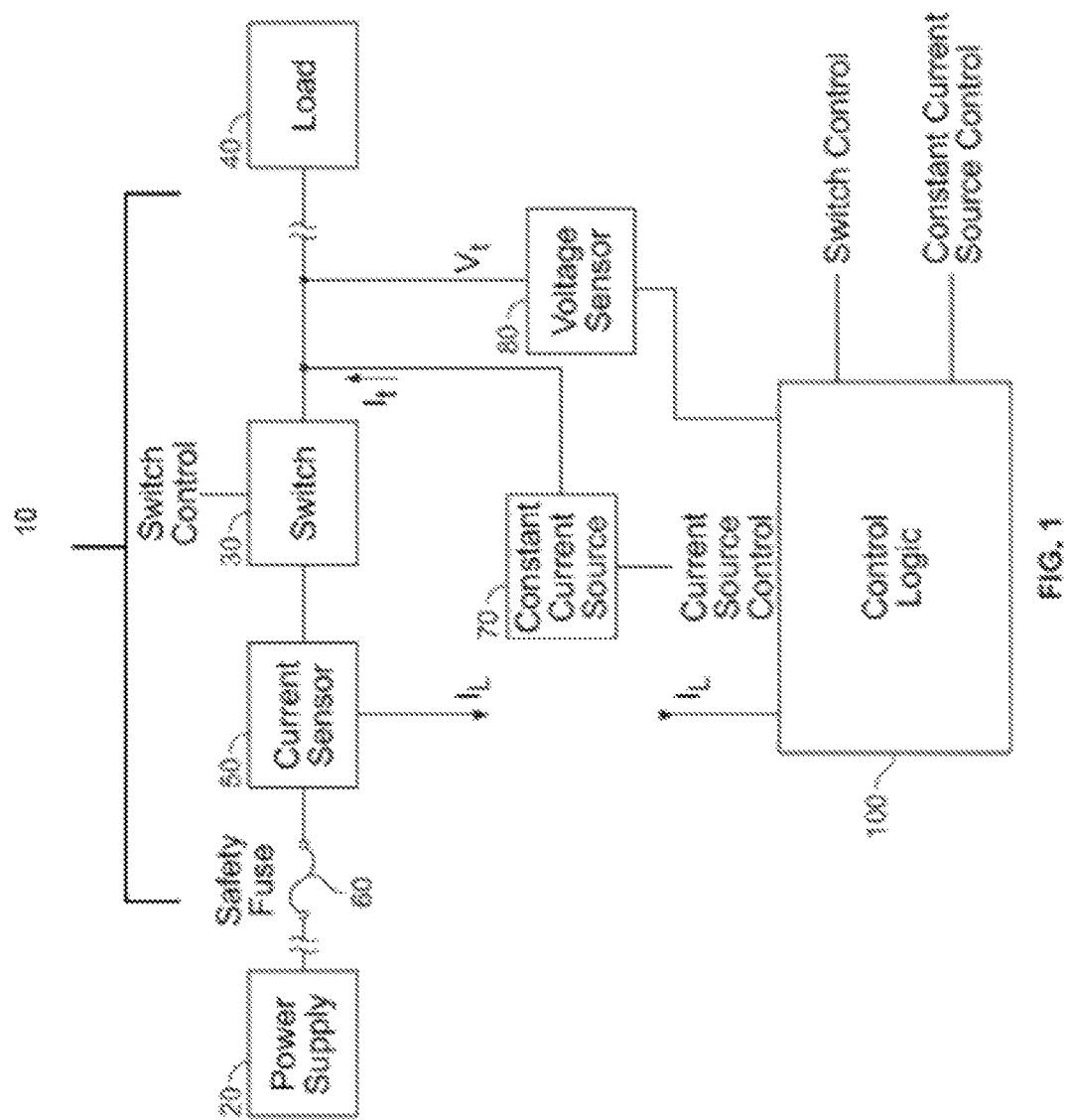
FIG. 1 is a simplified electrical block diagram of an example protective circuit (DCSS) including a controllable switch and sensors and logic to determine if the switch can be safely enabled.

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

The DC Smart Switch (DCSS) functionally emulates a DC circuit breaker with overload and input surge protection as well as pre-energizing load-characterization functions. In an example embodiment, each DCSS may be designed and sized to switch continuous DC current of up to 50 A at voltages up to 60 VDC as an example of use in a computer data center where power to various devices is supplied from a central supply at 48 VDC nominal.

Embodiments are examples of the practical realization of the concepts described herein and should not be considered as limiting as to current or voltage, method of control or the like.

The DCSS includes a current sensor that can be programmed to cause the switch to turn off when a specific level of current is reached or exceeded, either in steady state or transient situations as would be expected of a circuit breaker. The DCSS also provides for sensing the characteristics and presence of a load on the output terminals prior to enabling the "closure" of the circuit breaker. We may use the terms "closure", or "opening" or "tripping", of a circuit breaker to conceptually represent the enablement or interruption of a electrical path, respectively, as is understood in the art, without implying some mechanical action, although electromechanical switching is not excluded. The action of such a circuit breaker may be controlled either electrically or mechanically. In some instances the presence of a switch-like mechanical lever, button or the like, may be used to facilitate operation by personnel without an understanding of the detailed functioning of the DCSS, to provide emergency backup, or the like. Such functions may include mechanical position or motion, as examples, so as to indicate the status.

Prior to performing a closure operation, whether locally or remotely, the DCSS may be configured to detect the presence of a substantially capacitive load, a short-circuit condition or an open-circuit condition, to enable the switch to turn on where predetermined acceptable load conditions are verified, to remain tripped if the current required by the load is determined to be one which exceeds the capacity of the switch, or if the capacitance of the load would cause an unacceptably large input current surge, or if an open-circuit exists at the output terminal. The enabled DCSS trips, when connected to a load, when predetermined overload conditions occur, preventing damage to the main switching element.

The DCSS main switching element may be an N Channel MOSFET as the pass transistor device or other semiconductor device used to switch current. Herein, we describe a non-limiting example where up to 8 loads may be supplied from a common DC supply having a nominal capacity of 50 ADC at 48 VDC. Higher or lower power and voltage versions may be envisaged with similar characteristics. Typical device design provides for some margin of safety so that the MOSFET may tolerate over-current conditions for programmable or predetermined durations of up to several hundred milliseconds depending on the percentage overload. However, as the overload tolerance increases, so does the need for a larger heat sink to manage the junction temperature of the semiconductor device. This may increases the physical size of each switch element and may make the switch enclosure have an unwieldy size. This is not intended to preclude such designs.

Moreover, circumstances may arise where the main switching element is an electromechanical contactor or switch with the sensing and control features describe herein.

Detection of an excessive capacitive load or short-circuit-like condition is performed prior to allowing the main switching element to turn on. For purposes of this description, a short circuit is any static load current load that exceeds a preset level. If open-circuit detection is performed, an open circuit is one which exceeds a preset impedance. A second MOSFET or a resistor circuit connected to the load side of the main switch element may provide a substantially constant-current output for a fixed time duration to the load.

For example, a constant DC current of N amperes may be provided for a predetermined period of less than a second, where N is a predetermined fraction of the trip current level of the individual switch. During the measurement time period, the voltage on the load side of the main MOSFET switch element is monitored. A predetermined voltage level $V_{MIN}$ is established depending on the DCSS capacity, power supply capacity or preprogrammed limits.

In an example where the individual circuit may have a trip current of 50 ADC at −48 VDC, the DCSS control circuit is set to detect a rise in voltage at the load connection of 1.0 VDC in response to the application of the constant current of 1 ampere within the duration of the applied current. A rise of voltage above the preset level $V_{MIN}$ indicates that when the full DC power supply voltage is applied to the circuit by the main MOSFET pass transistor, the current of 50 amperes required by the attached load will not exceed the switch design capacity, or programmed limits. That is, a voltage of 1.0 VDC at a current of 1 ampere implies that the load has a resistive component of about 1ohm, consistent with the 50 ampere trip current when the switch is subsequently closed. This analysis is merely indicative and does not include tolerance sand possible consideration of some in-rush current.

If the voltage at the load connection does not increase above the preset $V_{MIN}$ during the time that the test current applied is the main switch element will not turn on, and at the end of the controlled duration the main switch is placed in a tripped state. If, during the controlled time duration, there is a rise in voltage equal to or greater than $V_{MIN}$ the main switch MOSFET will be turned on providing full voltage and current needed by the load without overloading the switch. The voltage may be determined by any suitable circuitry such as a voltage comparator, an analog-to digital converter, or the like, depending on the specific device design.

A person of skill in the art would recognize that the term "constant current" in this application could be practically achieved by a voltage source with a sufficiently high resistance in series, so that the supplied current is relatively independent of the load resistance or capacitance. The expected rise in voltage and threshold $V_{MIN}$ and the measurement time period would be adjusted accordingly by design.

DCSS of this design may be controlled locally as individual switches, groups of switches, or the like, depending on the specific product configuration. In an application where individual DCSS are used, standardized settings, analogous to those of conventional circuit breakers may be established as fixed settings. Alternatively, or additionally, the switches may be controlled through a conventional communications-type interface. As such, the response to remote commands may be reported, as well as state changes such as failure to close or tripping. Other conventional measures such as voltage and current may also be reported through an electronic interface. Either at a local control panel or remotely, the capacity limits of each switch may be set individually, within the design range of the individual switches and power supply capacity.

Groups of switches may be individually set so that each switch may have a different set of control values. In an aspect, a group of switches may be managed so that the total amount of current drawn by the group of loads is within the capacity of the main DC supply. This permits a variety of different types of loads to connect through the DCSS group while protecting against a configuration exceeding the total capacity of the main DC supply. As such, the possibility of tripping the breaker or fuse of main DC supply is avoided.

The control unit can be pre-programmed to allow a specific level of current, a percentage overload current and the duration that an overload that can be permitted to exist before the switch is turned off and placed in the tripped state. The occurrence of a short circuit on the load side of the switch while the switch is turned on that causes current in excess of the predetermined overload (which may be a percentage of the DCSS switch setting) and will result in an immediate turn-off of the switch and entering a "tripped" state.

The current sensor may be a Hall-effect sensor that has a response time of, for example, 2.5 µs, so that the amount of time where excess current will flow can be minimized. The 2.5 µs response time of such a sensor enables overcurrent fault detection in safety-critical applications. Typically, a fault condition is permitted to be present for a predetermined period of time to avoid transient events that can be accommodated by the power supply configuration from tripping the DCSS; a typical delay of, for example, about 35 µs to 150 µs may be selected as a balance between protecting the main MOSFET (or other semiconductor switch) and the cost and space required for a heat sink. The specific values of the parameters chosen is a consideration in the detailed design of a particular product.

A separate voltage threshold detection circuit or analog-to-digital converter 80 is connected to the output of the current sensor at the output of the switch 30. This circuit may, for example, have a pre-set reference voltage that corresponds to the output voltage of the current sensor for case where the load current from the DC power supply equals the trip threshold of the DCSS or be configurable to determine the amount and duration of the event prior to actuating the DCSS.

FIG. 1 is a functional block diagram of a single DCSS 10, where the current switch 30 may be a MOSFET such as a IXFK420N10T, used as a pass transistor element and available from Littlefuse through many distributors, that is disposed in the path between a DC power supply (which is often external to the DCSS) and any electrical apparatus requiring such power, which may be generalized as a load 40. MOSFET devices of this type are available in a wide range of voltage and power ratings, and would be selected depending on the specific product.

A Hall-effect current sensor 50 may be, for example, a ACS772 having a 200 kHz Bandwidth, available from Allegro MicroSystems, LLC, Manchester, N.H. The sensor is a precision, low-offset linear Hall-effect circuit with a copper conduction path for the measured current located near the semiconductor die. Current flowing through the conduction path generates a magnetic field which the Hall effect integrated circuit converts into a proportional voltage, which may be sensed, for example, by the control logic 100.

Typically, a physical fuse 60 is inserted in the current path as a secondary protection measure in the event of a failure of the electronic features of the DCSS.

The constant current source 70 is connected to the load side of the current switch 30. This high-impedance constant-current source may be, for example, a IRFB3077PBF MOS- FET manufactured by Infineon Technologies and available from available from a number of distributors. When energized, the constant current source provides a fixed current to the path between the current switch 30 and the load 40. In a particular application, the current output of this source may be a predetermined fixed value, or the current output may be controlled as a part of the overall switch characterization and control by the control unit 100, so as to particularize the DCSS for multiple uses.

Detection of open-circuit connections may be facilitated by providing a high resistance connected across the output terminals of the constant current source. When there is no connection to the DCSS output ,the current flows only through the high resistance, and the value of the resistance is set to provide a voltage higher than a second predetermined threshold, yet a small enough value for safety considerations. Alternatively, where the current source is a high resistance in series with a voltage source, the measured voltage rises to that of the voltage source when an open circuit is encountered during the measurement period.

Prior to closing the current switch 30, the characteristics of the load 40 are checked to determine that the current, I, that will flow from the power supply 20 to the load 40 will be within the preset capability of the DCSS 10, so as to prevent damage to the current switch 30, the blowing of the safety fuse 60, or damage or overload of the power supply 20 when multiple DCSS are connected to a common power supply.

The pre-closing testing of the load characteristics is performed by applying a fixed current $I_t$ by the constant current source 70 and measuring the $V_t$ with a voltage sensor 80 on the line between the MOSFET current switch 30 and the load 40. When the switch 30 is open, the current $I_t$ from the constant current source 70 flows into the load 40 as the MOSFET output is in a high impedance state.

Figure 2:
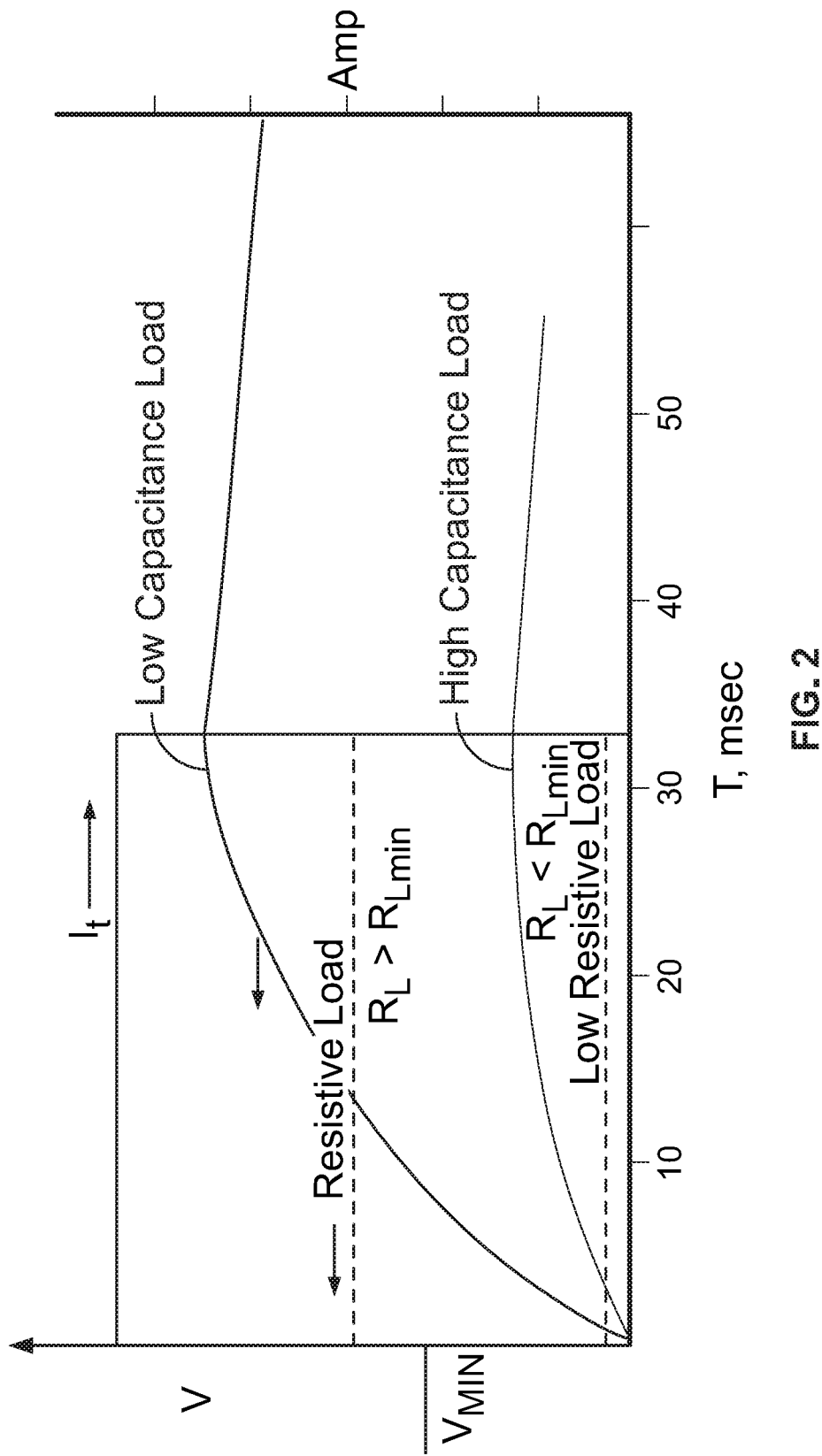
FIG. 2 is a graph illustrating examples of time histories of the measured voltage resulting from applying a constant current source to the load terminal of the protective circuit based on various load types.

The load 40 of a DC circuit may be characterized as having a input resistance and a capacitance. Where the load 40 is purely resistive, having a resistance R, the voltage $V_t$ expected is $V_t = I_t R$. FIG. 2 shows several response curves, including the both a suitable resistive load and a low resistive load. In this example, the constant current $I_t$ is applied for about 35 ms. This is merely an example and both shorter and longer time periods may be selected as a design consideration. In this example, a suitable load creates a voltage of $I_t R$ and this is greater than a preset value $V_{MIN}$. The maximum current, $I_{trip}$, to be supplied by the DCSS is the supply voltage VDC divided by the minimum input resistance $R_{min}$ of the load 40 (V/$R_{min}$). So, the expected voltage $V_{MIN}$ corresponding to the trip current $I_t$ and $R_{min}$. If however, the resistance of the load is less than $R_{min}$, the voltage produced during the constant current test period will be less than $V_{MIN}$, indicating that the current drawn by such a load would exceed the current trip setting of the DCSS. In such an instance the switch will not be commanded to close. As shown in FIG. 1, the voltage produced during the constant-current test period is sensed by the control logic unit 100, however, the sensing and control functions may be integrated into the switch itself in other embodiments. The switch may be fitted with a mechanical tab that may serve the function of a manually controlling the switch.

The load 40 may also be characterized as having an input capacitance C. Applying a constant current $I_t$ to such a load will drive charge into the capacitance C and raise the terminal voltage of the capacitance (The initial rate of rise for a pure capacitance is a linear function of time inversely proportional to the capacitance; in practice, there is also a resistive component and the time history may have an exponential behavior). This test method is safe for any value of capacitance, since the current supplied is predetermined and within the capability of the test circuit. However, a high capacitance load, when connected to the DC power supply, which will supply a current dependent on the load characteristics, may experience a surge in current at the time of switch closure that exceeds the switch trip rating and that may exceed the capacity of the power supply itself, causing the safety fuse to blow, and possible other damage. The rate of rise of the test voltage during the constant-current test depends on the input capacitance and resistance in the supply line between the output of the current switch 30 and the load 40, acting as a resistance-capacitance circuit having a time constant.

In FIG. 2, this behavior is conceptualized by showing a low capacitance load, where the switch may be safely closed, and a high capacitance load where the inrush current at switch closure would be excessive. In the former case, the $V_{MIN}$ is exceeded during the time period when the current source is operating, and in the latter case, it is not. So, the value of a test voltage $V_t$ arising from the application of a test current $I_t$ for a finite duration of time may be used to determine whether the switch may be safely closed. The inventors have tested this concept with capacitors of up to 10,000 microfarads with power supplies capable of delivering 400 amperes at 50 VDC. These values are not a limitation on the scope of the disclosure but are an example of a practical use of a switch using the concepts disclosed herein. Loads in data centers that are intended to be connected to an external power supply may have a significant input capacitance in order to suppress the periodic variations in current demand of the DC-DC converter or regulator arising from the use of electrical commutating techniques in the design thereof. Suppressing these variations is often needed to reduce electromagnetic interference to other equipment.

If open-circuit protection is also desired, in an example, a high resistance value may be connected across the current source 70 and scaled such that the resulting voltage across the output terminals of the DCSS is greater than a second predetermined value which is greater than an expected first predetermined voltage condition where the switch can be closed with the load attached. Where the "constant current" source is approximated by a voltage source with a series high resistance, one would appreciate that the resultant measured voltage at the measurement point would be equal to the source voltage if there were an open circuit.

While the circuit if FIG. 1 may be suitable for certain ranges of voltages and currents, a wider range of applicability may result if the switch control function performed by the control circuit 100 actuates a electromechanical contactor or relay having a rating for the service being controlled. This may be a single-pole single-throw switch with electrical control of actuation, or may be a double-pole single-throw switch if a common ground return is not used.

Since the DCSS 10 can be used to protect the DC power supply 20 by limiting the current supplied by each DCSS to a predetermined maximum value, as well as limiting the inrush current on switch closure to a value consistent with the steady-state current, a plurality of DCSS switches 10 may be connected to a single DC power supply 20 capable of supplying a predetermined load that is a composite of the individual loads.

Figure 3:
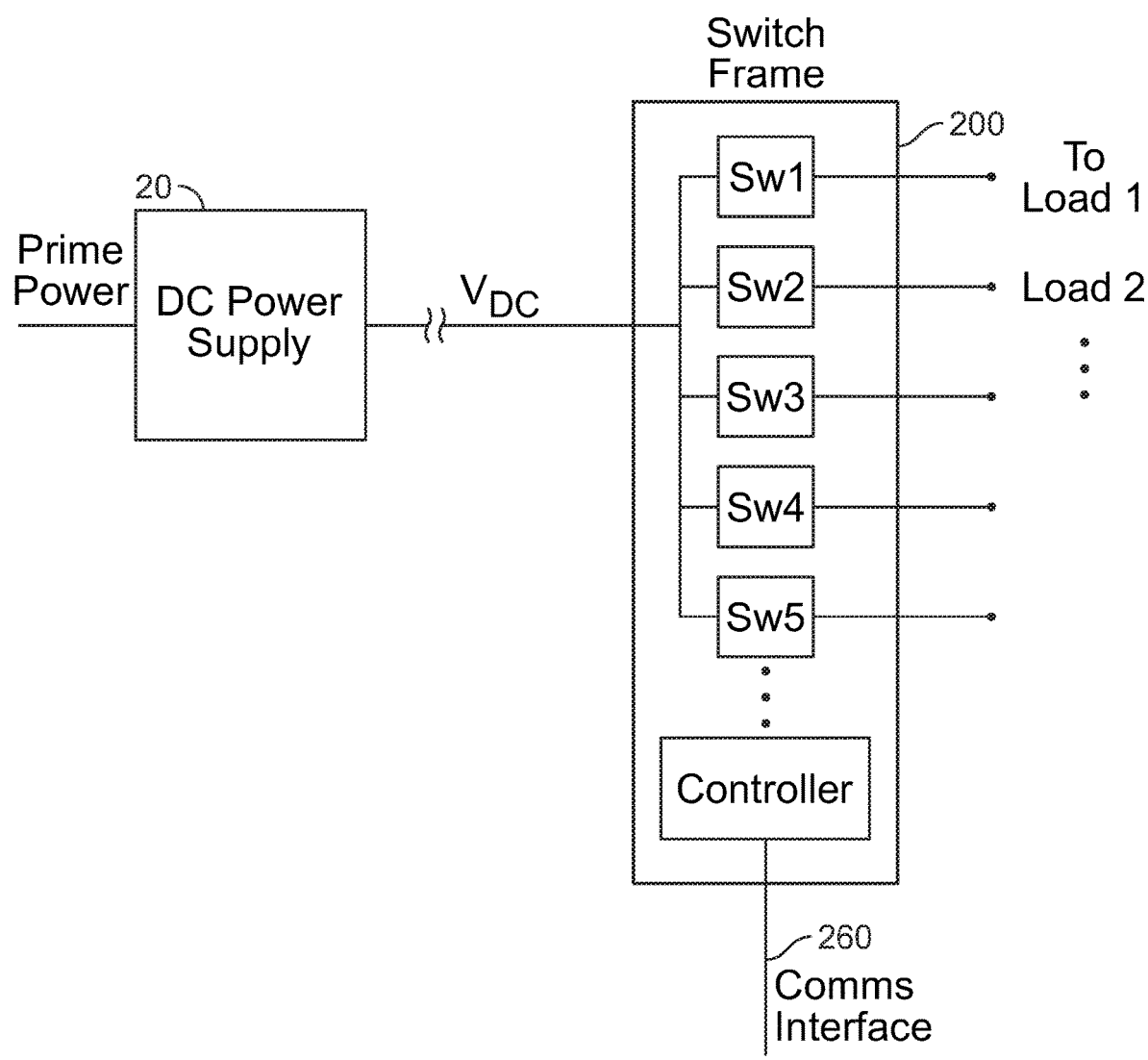
FIG. 3 is a block diagram of a system employing a plurality of DCSS modules and a controller to control the supply of current from a DC power supply to a plurality of electrical load, where the criteria for enabling the DCSS may be selected for each connected load.

FIG. 3 shows a DCSS switch frame 200 comprising a plurality of DCSS 10 interposed between the DC power supply 20 and a corresponding plurality of loads, where each load 1 . . . N may have different characteristics that are accommodated by the individual DCSSs, and where the total load on the DC power 20 supply may be monitored and controlled by local or remote control logic.

In another example, a DC power 20 supply having a rated capacity of 300 amperes may be connected to 6 loads, each having a maximum current requirement of 50 amperes at 48 VDC. So, the total amount of current demand may be limited by the installed DCSS switches to the rated capacity of the power supply. This is somewhat simplistic, as some accounting must be made for circuit tolerances and for variability of inrush currents. However, it would be possible to control a plurality of circuits, each having its own maximum permitted current demand so that circuits having requirements both greater than 50 amperes and less than 50 amperes could be safely be simultaneously connected to a common DC power supply. Additionally, since the sensing of circuit characteristics is done in a minimal amount of time (e.g. 35 ms) the individual DCSS switch activations may be done in an almost simultaneous manner while allowing for some variability of inrush currents.

A communications interface 260 is shown, and in conjunction with a controller 100 may permit the control function to be remotely located from the switch frame 200. Modern installations often locate the equipment requiring power control in a separate room from the control and monitoring functions, and the DCSS may be located close to the loads to minimize power loss and facilitate local emergency control. The communications interface may be any of the current communications interfaces, both wireless and physical, including Ethernet, TCP/IP over a communications network such as the Internet, WiFi and fiber optics.

The switch control parameters may be stored in a non-volatile computer readable memory such as FLASH memory or the like so that the parameters are retained in the event that there is a power outage. In the event of such an outage, when the power is restored, the switch controller may execute a recovery procedure to check the status of each load, and restore the power to loads that were being supplied at the time of the power failure which still meet the criteria for switch closure. Alternatively, the status of each switch may be reported to a control location and the actions performed in a remote manual manner. Such remote control of the individual DCSS may be convenient when a load device is re-booted after a software update or to overcome a fault. In single switch applications or standard configurations, the control parameters may be set by resistor or capacitor values and logic circuitry so that the parameters are determined for applications where cost considerations may be important or where adjustment of parameters is not desirable.

The controller 100 may be a single-board computer, or the like, having integral non-volatile memory, a communications interface and an input/output display 300. Such displays may be LED, LCD, OLED or other technology appropriate to entering and displaying alphanumeric data, for example, in raster or vector formats, and may include a touch-sensitive surface area or keyboard for operator control. The display may show the current switch settings and status.

Figure 4:
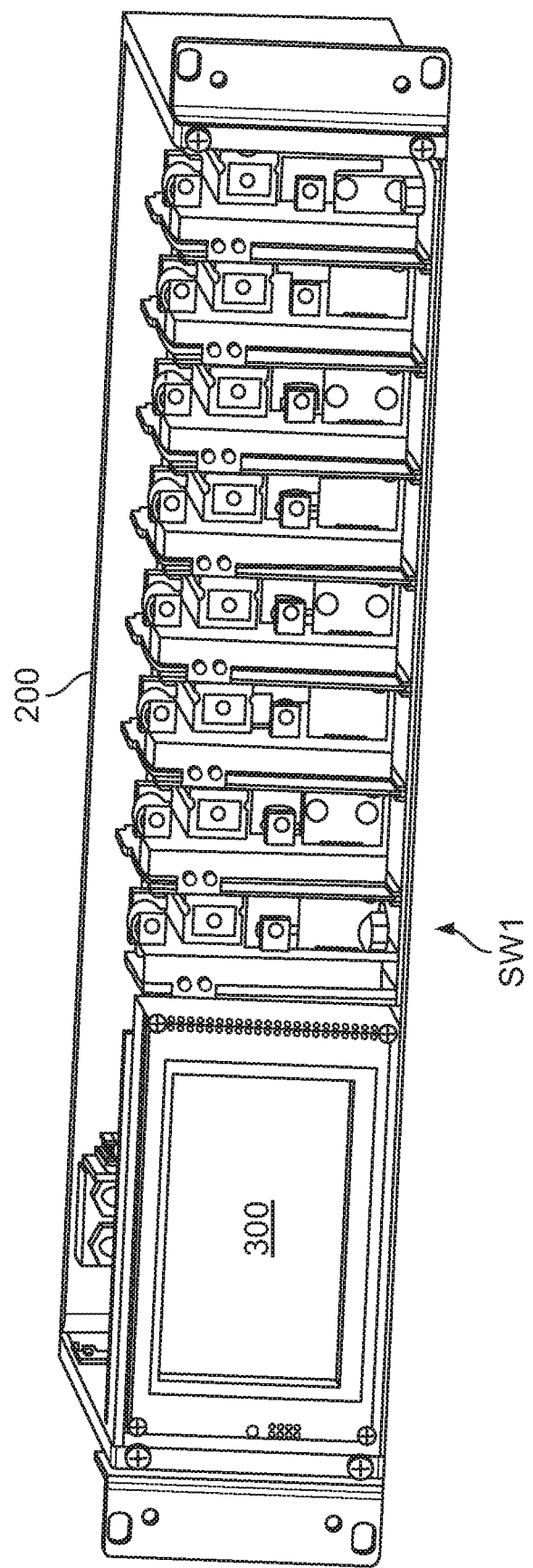
FIG. 4 is a representation of a physical embodiment of FIG. 3 where the individual DCSS may be removed and replaced and the criteria for operating the individual DCSS may be controlled through an alphanumeric or graphical display.

FIG. 4 illustrates a physical concept of a switch frame, with a front cover removed so that the individual DCSS switches 10 that plug into the frame can be seen. Each of the DCSS, which would be colloquially called circuit breakers, could be configured so as to plug in from the front, so that they may be conveniently replaced, if necessary. The frame or the individual DCSS modules may be provided with indicator lights (not specifically identified in FIG. 4) that provide individual breaker status (e.g., on, off, tripped), system status, such as DC voltage on, master circuit breaker tripped, or the like. Alarm sounders may also be provided.

FIG. 5A is an image of an example of a control display 300, showing the number of installed switches and a soft key for accessing different display formats from a menu. FIG. 5B summarizes the status of the individual installed DCSS. As shown, there are only two operational switches, switch 1 and switch 2. The commanded status of the switches (on or off) and the operating condition (normal or tripped) as well as the amount of current being supplied through the switch may be shown. When a switch has been tripped, an operator may attempt to reset the switch through this panel. In the tripped condition, pressing the ON button will attempt to reset the DCSS, which will be successful if the previously described conditions for turn on are satisfied; otherwise, the DCSS will remain tripped. When in a remotely-controlled mode, the switch frame may be configured to permit local override of the remote settings. Alternatively, the switch frame may be configured to be in a local control mode, but reporting status to a remote location. Other configurations of control and reporting may be established depending on the specific application of the device.

Figure 6A:
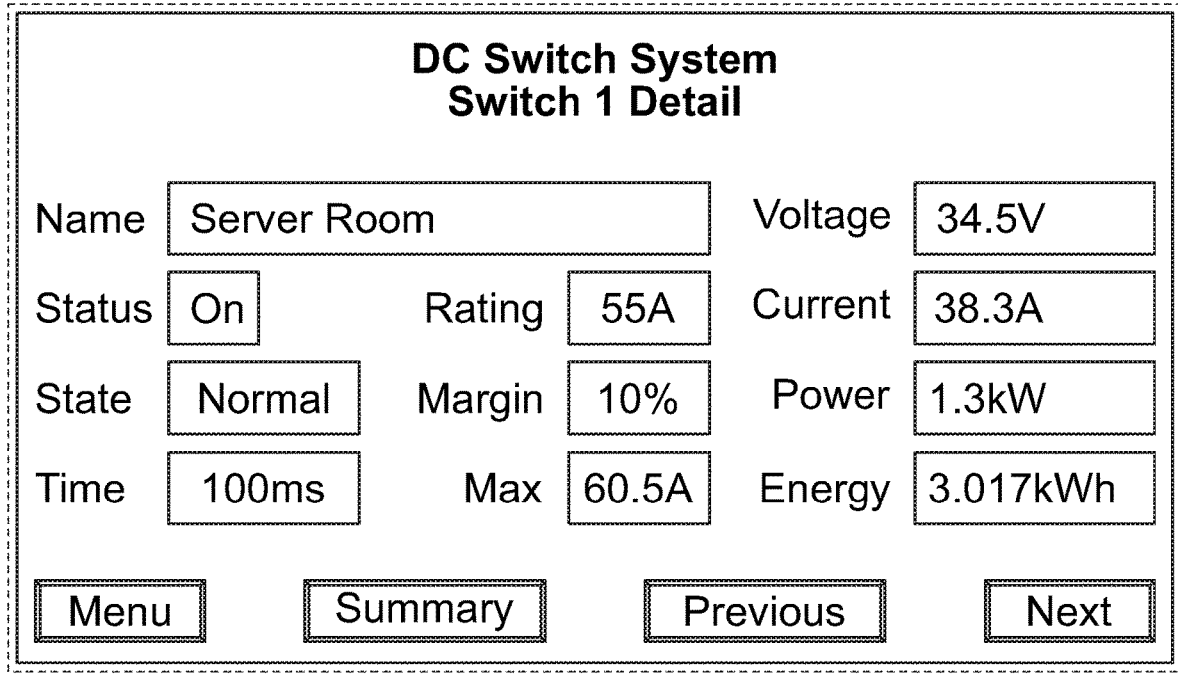
FIG. 6A is another representation of a screen format pertaining to the monitoring and control of an individual DCSS.
Figure 6B:
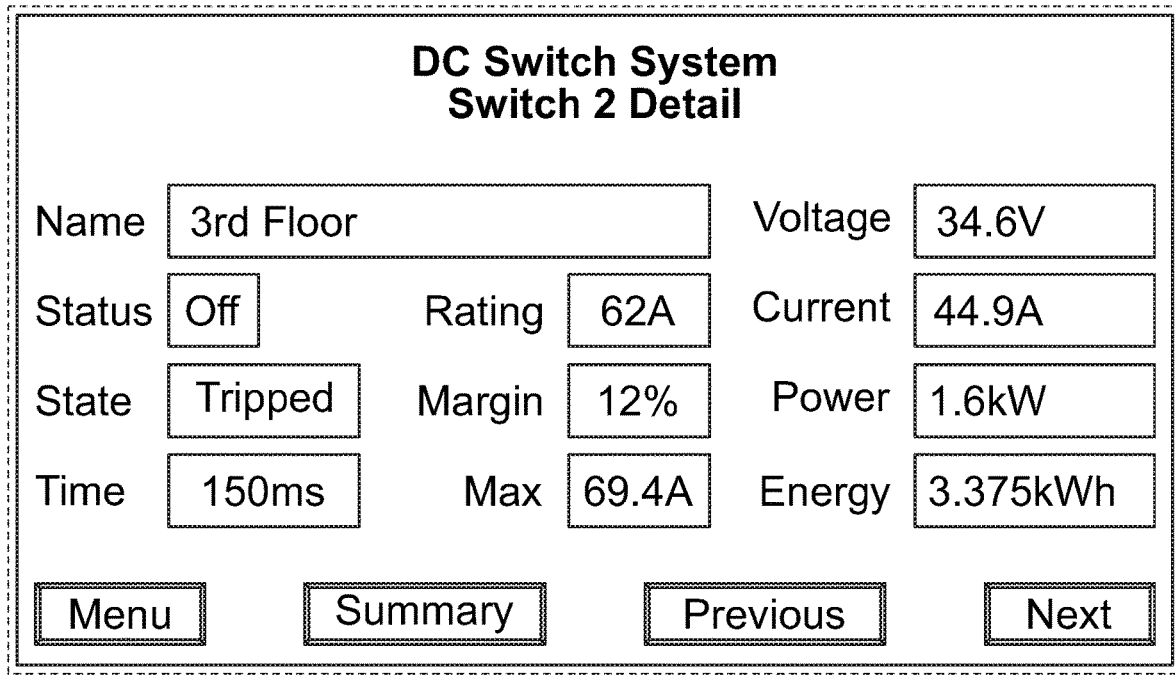
FIG. 6B is similar to FIG. 6B, where the characteristics of another DCSS are displayed.

FIGS. 6A and 6B show images of the display where details of an individual switch operational characteristics may be shown and controlled. The status and state and actual current flowing through the switch are as previously described, and the total DC power may also be shown. Each DCSS may be preset with default operating parameters such as maximum continuous current, a percentage margin and maximum instantaneous current, and the time period for which the maximum instantaneous current is permitted prior to tripping the switch. Each example of DCSS product specification sheet may have maximum permitted values of these parameters, and the switch may not be programmed to exceed these limits.

Where the maximum current requirements of a connected device are known, they may be entered as switch current limits, so that the total of the maximum rated capacity of each switch, when summed for the entire switch frame may be greater than the capacity of the DC power supply 20, yet the total permitted current supplied by the switches of the frame 200 to the loads 40 will be controlled to be less than the capacity of the DC power supply 20.

Other information such as the main buss voltage and total frame current (not shown in this image) may be provided.

Figure 7:
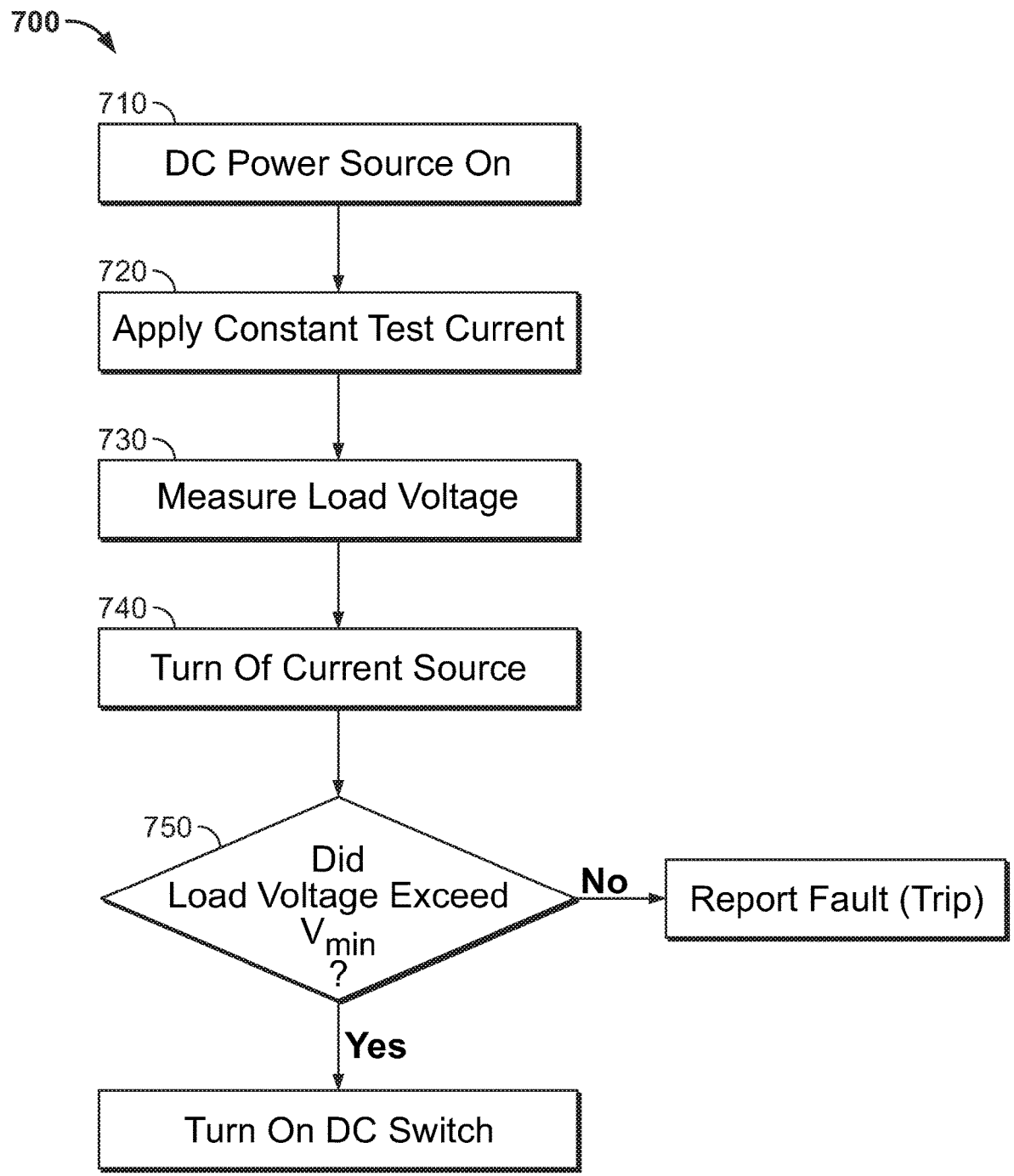
FIG. 7 is a flow chart of the method of operating the protective circuit to determine if the switch may be placed in a conductive mode.
Figure 8:
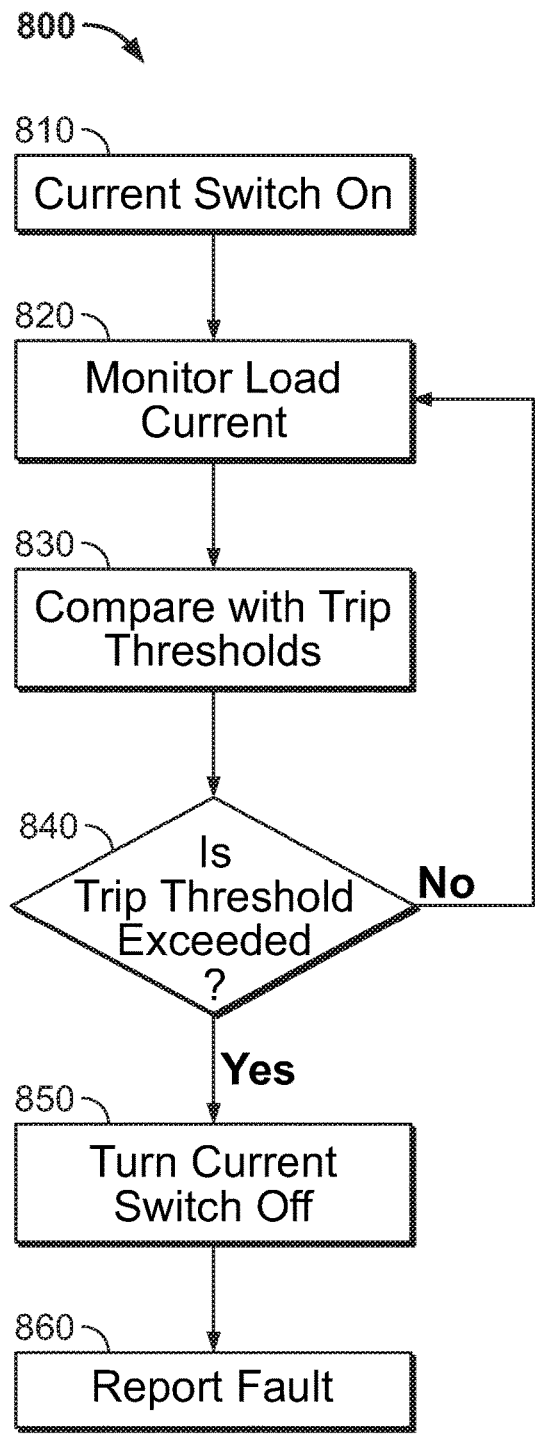
FIG. 8 is a flow chart of the method of operating the protective circuit to determine if the switch should be placed in a non-conductive mode.
Figure 9:
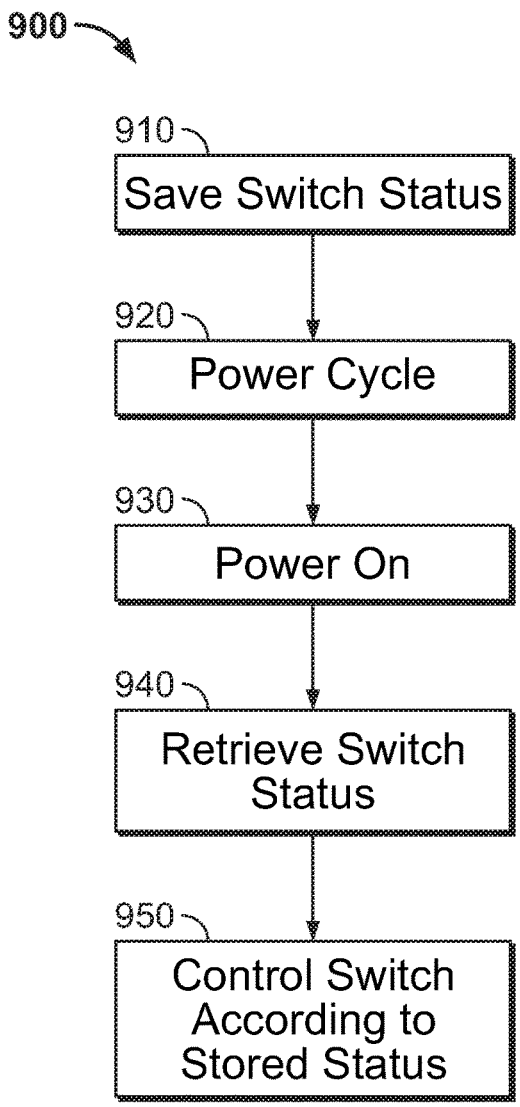
FIG. 9 is a flow chart for operation of a system comprising a plurality of DCSS where provision is made for restoring the operating conditions when restoring power after a loss of power by the switch control module.

In an aspect, the DCSS may be configured to operate as a stand-alone switch or as part of a switch frame 200, and be subject to either local or remote control. FIG. 7 may be used to understand both scenarios during a sequence 700 when the DC Power is first applied to the DCSS. The application of DC power 710 to the device begins the turn on-sequence. For first time operation the switch may need to be commanded to turn on. If the switch had been in the ON position when the power was turned off, the switch will attempt to turn on. The electronics applies a constant current at the load output of the DCSS 10 for a fixed period of time 720 while monitoring the evolution of the voltage at that node. After a fixed time 740, which may be 35ms, for example, a determination is made 750 as to whether the voltage has exceeded a threshold voltage that is a function of the rating of the DCSS, or its current maximum current setting. If the voltage is greater than the preset voltage, the DCSS may safely be energized 760. Otherwise, the switch is tripped or remains in the OFF position 770. This condition is reported locally or remotely in accordance with the switch configuration. In an aspect, an embodiment of SDCC may evaluate the load node voltage beginning at the time that the constant current source is applied, and if the measured voltage exceeds the preset test voltage, in an example, the switch may be energized prior to the completion of the 35 ms period. An upper voltage threshold may also be established to prevent energizing an open circuit. If a load is subsequently connected, the switch will operate as normal the next time it is enabled.

In operation 800, the DCSS monitors the current as measured by a current sensor 820 and compares the measured current 830 with a current value that is either characteristic of the specification of a single DCSS or the current value that has been controlled by a switch frame so as to limit the current to less than the specified maximum switch rating. If the threshold has not been exceeded 840 (No), the monitoring process continues at 820, while exceeding the threshold 840 (Yes) causes the switch to be tripped 850, and this act is reported either locally or remotely 860.

In an aspect, a switch in a frame may maintain the current status of the switch through a failure of the DC power supply. The status of each switch may be saved to a non-volatile memory 910 and the occurrence of a cycling off and on of the DC power supply 20 may be sensed 920. This may be done by reading the stored status data 940 each time DC power is applied to the frame 200. Switches that were off or tripped are not immediately restored, but switches whose state was ON at the time of loss of power may be turned on using the turn-on process, so that if there is not a potential overcurrent situation or open circuit, the power may be restored to the load. If there is an overcurrent situation, the power is not applied and the switch is reported to be tripped.

Remote control of DCSSC switches may be useful in maintaining data centers, networking facilities or the like, where groups of loads, such as computers, data storage arrays, switch controllers may have to be reinitialized after a power failure or a update of software, or replacement of equipment, and individual or group control of the process, or sequencing of the activation is desired. This may be performed by personnel activating the switches locally or remotely, or by a computer program intended for the purpose.

A person of skill in the art would appreciate that the DCSS circuitry could be incorporated into load devices as a protective measure.

It will be appreciated that the methods described and the apparatus shown in the preceding figures may be configured by, or embodied in machine-executable instructions, e.g. software, or in firmware, or in a combination of both. The machine-executable instructions can be used to cause a general-purpose computer, a special-purpose processor, such as a DSP, array processor, or the like, that acts on the computer-executable instructions to perform functions and actions described herein; that is, to act as a particular machine. Where a single instance of any component is described, a person of skill in the art would appreciate the circumstances where a plurality of the same or similar components may be employed.

Alternatively, the operations might be performed by specific hardware components that may have hardwired logic or firmware instructions for performing the operations described, or by any combination of programmed computer components and custom hardware components, which may include analog circuits. Such components may include Application Specific Integrated Circuits (ASIC), Field Programmable Gate Arrays (FPGA), or the like which may exist or are being developed and have the capability of configurable or predetermined logic.

The methods or configurations may be provided, at least in part, as a computer program product that may include a non-volatile (non-transient) computer-readable medium having stored thereon instructions which may be used to program (configure) a computer (or other electronic devices) to perform the methods or functions. For the purposes of this specification, the terms "machine (or computer)-readable non-transient medium" shall be taken to include any tangible medium that is capable of storing or encoding a sequence of instructions or data for execution by a computing machine or special-purpose hardware and that may cause the machine or special purpose hardware to be operable to perform the methodologies or functions of the system and method described herein. The term "machine-readable medium" shall accordingly be taken include, but not be limited to, solid-state memories, optical and magnetic disks, magnetic memories, and optical memories, as well as any equivalent device that may be developed for such purpose.

For example, but not by way of limitation, a machine readable data storage medium may include read-only memory (ROM); random access memory (RAM) of all types (e.g., S-RAM, D-RAM. P-RAM); programmable read only memory (PROM); electronically alterable read only memory (EPROM); magnetic random access memory; magnetic disk storage media; flash memory, which may be NAND or NOR configured; memory resistors; or electrical, optical, acoustical data storage medium, or the like. A volatile memory device such as DRAM may be used to store the computer program product provided that the volatile memory device is part of a system having a power supply, and the power supply or a battery provides power to the circuit for the time period during which the computer program product is stored on the volatile memory device.

For purposes of claim interpretation, the memory for storing a computer program product is "non-transient," where such a definition is given the broadest interpretation in terms of applicable memory types and techniques consistent with governing case law. Functions that are performed by a computer operable to process and execute the code may be equivalently performed by an electronic circuit. Where data is being stored, the term "non-volatile" memory may refer to any memory type where the data may be stored without loss when power is removed, including memory types where data is stored in another memory type in the event of power loss, using a back-up battery, supercapacitor, or other sufficient source of stored energy for that purpose. For avoidance of doubt, flash memory and hard disk drives are non-limiting examples of non-transient machine-readable memory.

Furthermore, it is common in the art to speak of software, in one form or another (e.g., program, procedure, process, application, module, algorithm or logic), as taking an action or causing a result. Such expressions are merely a convenient way of saying that execution of the instructions of the software by a computer or equivalent device causes the processor of the computer or the equivalent device to perform an action or a produce a result, as is well known by persons skilled in the art.

The telecommunications environment may the Internet, a local area network (LAN) a wide area network (WAN), or some combination of the architectures, typically using industry standard protocols such as TCP/P, HTML and the like over wire (physical, including fiber optic) or wireless links and serve to connect data processing and storage facilities that may be co-located or dispersed over wide geographical and political regions. Many users of the Internet do not own the facilities and make use of service providers on a subscription or fee-for-use basis of some sort, so the transport of information, commands and status information is presumed to occur as a purchased function under the control of the user for the specified purpose. Private communications networks, and virtual private networks (VPN) may be used for some or all of the communications channels. Herein, the selection of a particular communications channel for transfer of information between entities connected at the access points thereof should not be interpreted as a limitation on the subject matter disclosed or claimed, but rather to aid in understanding the system and method disclosed herein. Industry standard protocols are by their nature an evolving set of agreed requirements regulating the interoperability of devices, systems and methods of various manufacturers and further development of such standards is an expected evolution. At times, there may be communications protocols that are not widely accepted, but are in the course of experimentation and evaluation and so long as the communications protocols, networks and hardware provides for suitable communications between the entities.

A communications channel may be considered to be described as having a first end point and a second end point, and each end point may be characterized, for example, by a Uniform Resource Locator (URL) which may be a unique address on the Internet, or on another such communications channel. While information transfer on the Internet involves the intermixing of data packets from a wide variety of users, each user has a separately processed communications channel as defined by the endpoints.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

It is therefore intended that the foregoing detailed description be regarded as illustrative rather than limiting, and that it be understood that it is the following claims, including all equivalents, that are intended to define the spirit and scope of this invention.

What is claimed is:

1. A switch for controlling power supplied from a direct current (DC) power supply to a load consuming electrical power, comprising:
    a semiconductor switch element having a selectable conducting or non-conducting state, disposed in a path between the DC power supply and the load, and having a source connection and a load connection;
    a constant current source connected to the load connection of the switch;
    a voltage sensor connected to the load connection; and
    a voltage sensor circuit configured to compare the voltage measured by the voltage sensor circuit with a predetermined voltage threshold,
    wherein the constant current source is energized for a predetermined period of time to provide a predetermined current; and
    if the voltage measured by the voltage sensor exceeds a first predetermined voltage during the time when the constant current source is providing energized, the semiconductor switch element is controlled to the conducting state,
    else, if the voltage measured is less than the predetermined voltage, the non-conducting state is maintained
    wherein the predetermined voltage is determined based on a current supplied to the load by the DC supply when the switch is in the conducting state.

2. The switch of claim 1, further comprising:
    a DC current sensor disposed in path of the semiconductor switch between the source connection and the load connection,
    wherein if the current measured by the DC current sensor is less that a predetermined current, the conducting state of the semiconductor switch element is maintained, else the semiconductor switch element is placed in a non-conducting state and the switch is placed in a tripped state.

3. The switch of claim 2, wherein, responsive to a command to turn the switch on, the constant current source is energized for a predetermined period of time, and if the voltage measured by the voltage sensor exceeds a second predetermined voltage during the time when the constant current source is energized is, greater than a predetermined voltage the semiconductor switch element is the non-conducting state is maintained.

4. The switch of claim 3, where current sensor is a Hall-effect device.

5. The switch of claim 2, wherein the semiconductor switch is a MOSFET device.

6. The switch of claim 2, wherein when the switch is in a tripped or an off state, responsive to a command to turn the switch on, the constant current source is energized for a predetermined period of time, and if the voltage measured by the voltage sensor exceeds a predetermined voltage during the time when the constant current source is energized is, the semiconductor switch element is controlled to the conducting state, else if the voltage measured is less than the predetermined voltage, the non-conducting state is maintained.

7. The switch of claim 1, further comprising:
    a frame configured to accept a plurality of individual switches, the frame having a DC input terminal and each switch having a DC output terminal, wherein a DC input terminal of each switch is connected to DC input terminal of the frame;
    a controller configured to:
        control the maximum current permitted by each switch;
        maintain status information for each switch;
        receive commands to alter a status of each switch; and
        control the status of each switch.

8. The switch of claim 6, wherein the controller is configured to communicate over a communications channel.

9. The switch of claim 6, wherein the switch further comprises a display device capable of displaying alphanumeric data relating to switch status and accepting commands through soft keys on a touch sensitive surface.

10. A method of managing a DC circuit, comprising:
    providing a switch that comprises:

a semiconductor switch element having a selectable conducting or non-conducting state, configured to be disposed in a path between the DC power supply and the load, and having a source connection and a load connection;

a constant current source connected to the load connection;

a voltage sensor connected to the load connection; and a circuit configured to compare the voltage measured by the voltage sensor with a predetermined voltage threshold, wherein, providing that a DC voltage is present at the source connection, and a control signal is received to turn on the switch, a microprocessor communicating with the switch executes instructions stored on a non-transient non-volatile digital memory to perform the steps of:

controlling the constant current source to apply a predetermined current to the load connection for a predetermined period of time;

using the voltage sensor to determine the voltage at the load terminal during a period of time when the constant current source is applying the predetermined current; and selecting between the steps of:

changing the state of the semiconductor switch to conducting if the voltage exceeds a predetermined voltage level threshold during the predetermined period of time; or, maintaining the state of the semiconductor switch in a non-conducting state and indicating a fault.

11. The method of claim 10, wherein a status of the switch is stored in a non-volatile memory and reading, by the microprocessor, the status of the switch from the non-volatile memory when power is restored after a power outage and, if the status of the switch was conducting at the time of power failure, sending a control signal to the microprocessor to turn on the switch and, if the status of the switch was non-conducting, doing nothing.

12. The method of claim 11, wherein the microprocessor is combined with a touch sensitive display to perform, for each switch of a plurality of switches:

configuring a maximum current limit;
configuring a transient overload characteristic;
setting the predetermined time duration of the constant current;
setting the voltage level threshold for the constant current.

13. The method of claim 12, further including control of the microprocessor through a communications interface.

14. A protective circuit, comprising:

a voltage sensor connectable to an output terminal of an electrically actuated switch;

a constant current source connectable to the output terminal of the switch;

a control circuit, configured to actuate the constant current source for a predetermined period of time, to measure a voltage value determined by the voltage sensor during the period of time, the control circuit further configured to actuate the switch in a conductive state when a predetermined condition is determined.

15. The protective circuit of claim 14, wherein predetermined condition is the voltage value greater than a predetermined voltage value during at least some time interval during the period of time.

16. The protective circuit of claim 14, wherein predetermined condition is the voltage value a greater than a first predetermined value and less than a second predetermined value during at least some time interval during the period of time.

17. The protective circuit of claim 14, wherein the predetermined period of time is between about 35 milliseconds and 100 milliseconds.

18. The protective circuit of claim 14, further comprising the switch having an input terminal connectable to a source of electrical power and the output terminal to which an electrical load is connectable.

19. The protective circuit of claim 15 wherein the switch is a MOSFET.

20. The protective circuit of claim 15, wherein the switch is a pass transistor.

21. The protective circuit of claim 15, wherein the switch is an electrically actuated contactor or relay.

22. The protective circuit of claim 14, wherein the predetermined condition is adjustable through an electrical interface.

23. The protective circuit of claim 18, further comprising a current sensor disposed between the source of electrical power and the electrical load.

24. The protective circuit of claim 23, wherein the current sensor is a Hall-effect device.

25. The protective circuit of claim 22, wherein the current measured by the current sensor is greater than a predetermined value, the control circuit actuates the switch to a non-conductive state.

26. The protective circuit of claim of claim 23 wherein the predetermined value of current is adjusted through an electrical interface.

* * * * *

UNITED STATES PATENT AND TRADEMARK OFFICE
CERTIFICATE OF CORRECTION

| | | |
|---|---|---|
| PATENT NO. | : 11,563,433 B2 | Page 1 of 1 |
| APPLICATION NO. | : 17/061778 | |
| DATED | : January 24, 2023 | |
| INVENTOR(S) | : William Fechalos et al. | |

It is certified that error appears in the above-identified patent and that said Letters Patent is hereby corrected as shown below:

In the Claims

In Column 14, Claim 1, Line 9, delete "providing"

In Column 14, Claim 1, Line 13, insert --,-- after "maintained"

In Column 14, Claim 2, Line 18, insert --the-- before "path of the semiconductor"

In Column 14, Claim 3, Line 32, delete "is, greater than a predetermined voltage"

In Column 14, Claim 3, Line 33, delete "is" and replace with --in--

In Column 14, Claim 6, Line 45, delete "is" before ", the semiconductor switch element"

Signed and Sealed this
Twenty-ninth Day of October, 2024

Katherine Kelly Vidal
*Director of the United States Patent and Trademark Office*